US005767700A

United States Patent [19]

Lee

[11] Patent Number: 5,767,700
[45] Date of Patent: Jun. 16, 1998

[54] PULSE SIGNAL TRANSFER UNIT EMPLOYING POST CHARGE LOGIC

[75] Inventor: Jae Jin Lee, Kyoungki-do, Rep. of Korea

[73] Assignee: Hyundai Electronics Industries Co., Ltd., Kyoungki-do, Rep. of Korea

[21] Appl. No.: 673,210

[22] Filed: Jun. 27, 1996

[30] Foreign Application Priority Data

Jun. 30, 1995 [KR] Rep. of Korea ............... 95-18875

[51] Int. Cl.$^6$ ............... H03K 19/0185; H03K 19/017
[52] U.S. Cl. ............... 326/86; 326/17; 326/83
[58] Field of Search ............... 326/17, 21, 82–83, 326/86, 121

[56] References Cited

U.S. PATENT DOCUMENTS

| | | | |
|---|---|---|---|
| 4,498,021 | 2/1985 | Uya | 326/17 X |
| 4,598,216 | 7/1986 | Lauffer et al. | 326/86 X |
| 4,647,797 | 3/1987 | Sanwo et al. | 326/17 X |
| 4,692,637 | 9/1987 | Shoji . | |
| 4,899,066 | 2/1990 | Aikawa et al. | 365/203 X |
| 5,539,336 | 7/1996 | Nguyen et al. | 326/17 X |

Primary Examiner—Jon Santamauro
Attorney, Agent, or Firm—Gary M. Nath; Nath & Associates

[57] ABSTRACT

A pulse signal transfer unit employing post charge logic, comprising a buffering circuit for transferring data with a specified logic value through a data transfer line, a PMOS transistor for supplying a voltage from a voltage source to the data transfer line to initialize a signal on the data transfer line, and a feedback loop circuit for applying the signal on the data transfer line to the PMOS transistor for one of the first and second time periods in response to an external write drive signal to control the PMOS transistor, the second time period being longer than the first time period. According to the present invention, in the case of accessing read data with a relatively narrow pulse width and write data with a relatively wide pulse width, the pulse signal transfer unit initializes the read data at a relatively high speed and the write data at a relatively low speed to provide a signal with a wider pulse width. Therefore, the pulse signal transfer unit is capable of preventing the formation of a current path and enhancing the data processing speed.

6 Claims, 5 Drawing Sheets

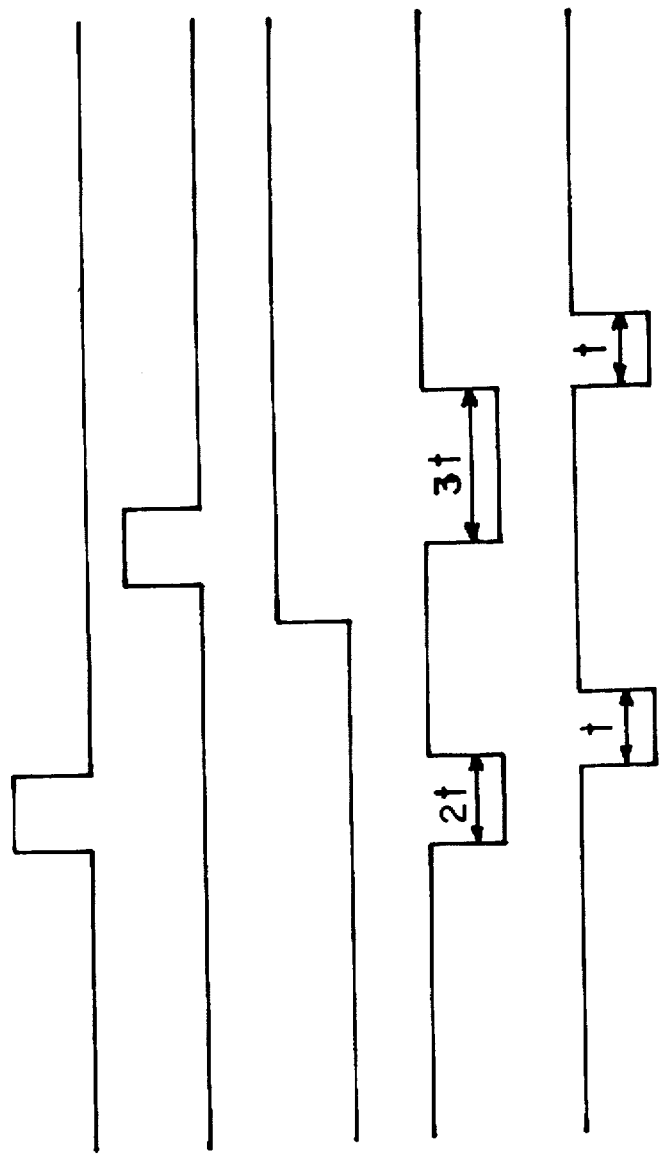

PULSE SIGNAL TRANSFER UNIT EMPLOYING POST CHARGE LOGIC

BACKGROUND OF THE INVENTION

1. Field of the Invention

The present invention relates in general to a pulse signal transfer unit for a semiconductor memory device, and more particularly, to a pulse signal transfer unit employing post charge logic in which, in the case where a single data line is used to transfer both input data and output data, a delay circuit initializing the data line has a shorter delay time in a data read operation and a longer delay time in a data write operation, thereby increasing the stability and pulse signal transfer speed of the unit.

2. Description of the Prior Art

FIG. 1 is a circuit diagram illustrating the construction of a conventional pulse signal transfer unit for a semiconductor memory device. As shown in this drawing, the conventional pulse signal transfer unit comprises a data line 40 for transferring data, a first input line 11 for inputting an external first pulse signal, a first NMOS transistor Q1 connected between a ground voltage source Vss and a node N1 on the data line 40, and a first NOR gate 13 for switching a signal at the node N1 to the inside or outside of the semiconductor memory device in response to an external first drive signal. The first NMOS transistor Q1 has its gate for inputting the first pulse signal from the first input line 11.

The conventional pulse signal transfer unit further comprises a second input line 21 for inputting an external second pulse signal, a second NMOS transistor Q2 connected between the ground voltage source Vss and the node N1, a PMOS transistor Q3 connected between a supply voltage source Vcc and the node N1 for initializing a voltage level of the signal at the node N1, a feedback loop circuit 30 for delaying and feeding back the signal at the node N1 to control the PMOS transistor Q3, and a second NOR gate 23 for switching the signal at the node N1 to the inside or outside of the semiconductor memory device in response to an external second drive signal. The second NMOS transistor Q2 has its gate for inputting the second pulse signal from the second input line 21. The feedback loop circuit 30 is provided with four inverters 31-34 connected in series between the node N1 and a gate of the PMOS transistor Q3 for delaying the signal at the node N1 for a predetermined time period and transferring the delayed signal to the gate of the PMOS transistor Q3.

The operation of the conventional pulse signal transfer unit with the above-mentioned construction will hereinafter be described with reference to FIG. 2.

FIG. 2 is a timing diagrams illustrating the operation of the conventional pulse signal transfer unit. For example, the first and second pulse signals from the first and second input lines 11 and 21 have different pulse widths as shown in (A) and (B) of FIG. 2. Noticeably, the first and second pulse signals from the first and second input lines 11 and 21 are data signals.

First, when the first pulse signal from the first input line 11 as shown in (A) of FIG. 2 is applied to the gate of the first NMOS transistor Q1, the first NMOS transistor Q1 is turned on to supply a low level signal to the node N1. The low level signal at the node N1 is delayed for the predetermined time period by the feedback loop circuit 30 and then applied to the gate of the PMOS transistor Q3. The PMOS transistor Q3 is turned on in response to the low level signal at its gate to generate a pulse signal delayed by time a as shown in (C) of FIG. 2 on the data line 40. At this time, if the first drive signal is low in level, the first NOR gate 13 inverts the delayed signal on the data line 40 and outputs the inverted signal.

Thereafter, if the second pulse signal from the second input line 21 which has a pulse width wider than that of the first pulse signal from the first input line 11 as shown in (B) of FIG. 2 is applied to the gate of the second NMOS transistor Q2, the second NMOS transistor Q2 is turned on to supply a low level signal to the node N1. The low level signal at the node N1 is delayed for the predetermined time period by the feedback loop circuit 30 and then applied to the gate of the PMOS transistor Q3. The PMOS transistor Q3 is turned on in response to the low level signal at its gate to generate a pulse signal delayed by time a as shown in (C) of FIG. 2 on the data line 40. At this time, if the second drive signal is low in level, the second NOR gate 23 inverts the delayed signal on the data line 40 and outputs the inverted signal.

Noticeably, the conventional pulse signal transfer unit may employ post charge logic to transfer a plurality of read and write data in both directions or to transfer a plurality of read or write data in the single direction.

However, in the conventional pulse signal transfer unit employing the post charge logic, when the time of the pulse width of the input signal is longer than the delay time of the feedback loop circuit 30, a current path is formed between the PMOS transistor Q3 and the first NMOS transistor Q1 or between the PMOS transistor Q3 and the second NMOS transistor Q2, resulting in the generation of leakage current. The generation of leakage current reduces the stability of the unit and causes unnecessary power consumption. Also, in the case where the initial signal on the data line 40 has a pulse width wider than that of the input signal, the subsequent data processing speed is degraded.

SUMMARY OF THE INVENTION

Therefore, the present invention has been made in view of the above problems, and it is an object of the present invention to provide a pulse signal transfer unit employing post charge logic which is capable of securing the stability of the unit, reducing unnecessary power consumption and transferring a pulse signal at high speed.

In accordance with the present invention, the above and other objects can be accomplished by a provision of a pulse signal transfer unit employing post charge logic, comprising buffering means for transferring data with a specified logic value through a data transfer line; initialization means for supplying a voltage from a voltage source to the data transfer line to initialize a signal on the data transfer line; and control means for applying the signal on the data transfer line to the initialization means for one of first and second time periods in response to an external write drive signal to control the initialization means, the second time period being longer than the first time period.

BRIEF DESCRIPTION OF THE DRAWINGS

The above and other objects, features and advantages of the present invention will be more clearly understood from the following detailed description taken in conjunction with the accompanying drawings, in which:

FIG. 5 is a timing diagram illustrating the operation of the pulse signal transfer unit in accordance with the present invention.

DETAILED DESCRIPTION OF THE PREFERRED EMBODIMENTS

Figure 1:
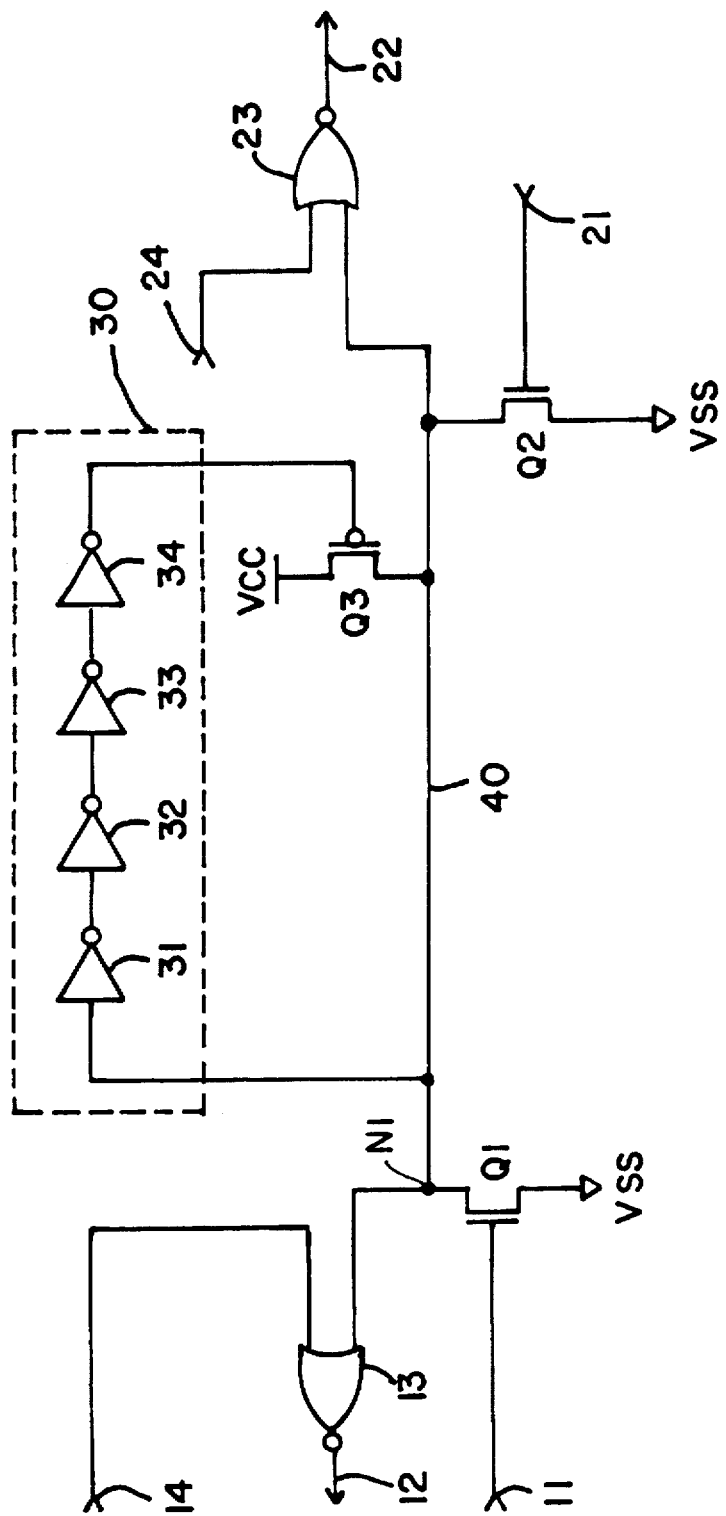
FIG. 1 is a circuit diagram illustrating the construction of a conventional pulse signal transfer unit employing post charge logic.
Figures 2A, 2B, 2C:
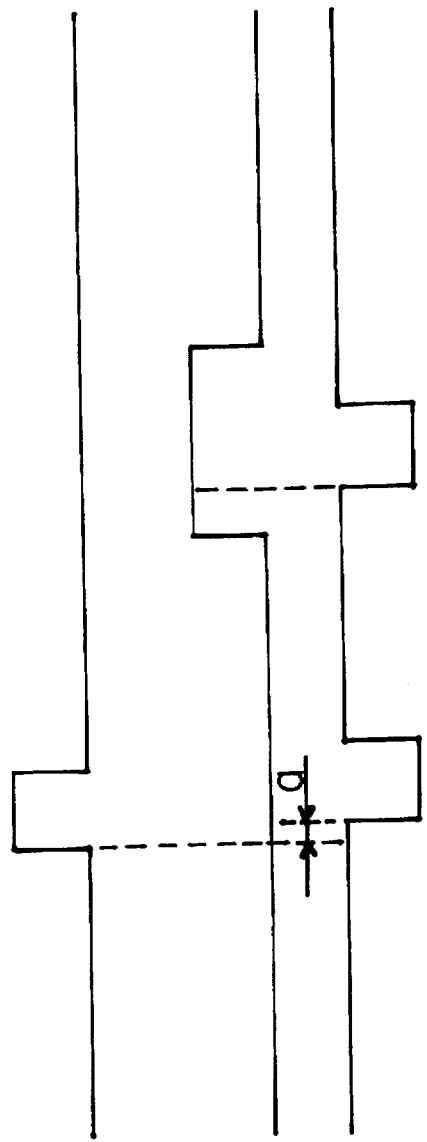
FIG. 2 is a timing diagram illustrating the operation of the conventional pulse signal transfer unit.
Figure 3:
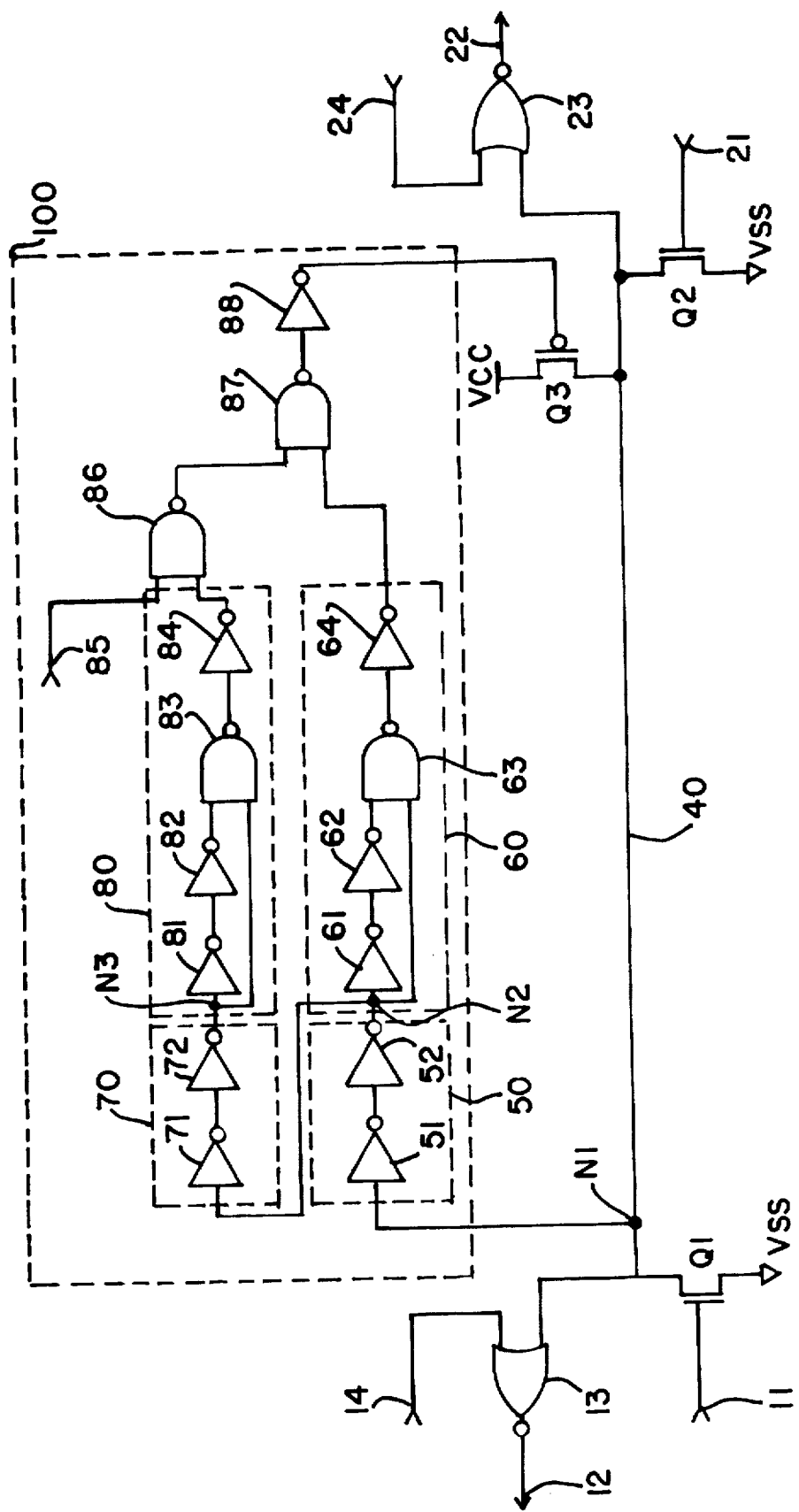
FIG. 3 is a circuit diagram illustrating the construction of a pulse signal transfer unit employing post charge logic in accordance with a first embodiment of the present invention.

FIG. 3 is a circuit diagram illustrating the construction of a pulse signal transfer unit employing post charge logic in accordance with a first embodiment of the present invention. Some parts in this drawing are the same as those in FIG. 1. Therefore, like reference numerals designate like parts.

As shown in FIG. 3, the pulse signal transfer unit comprises a data line 40 for transferring data, a first input line 11 for inputting an external first pulse signal, a first NMOS transistor Q1 connected between a ground voltage source Vss and a node N1 on the data line 40, and a first NOR gate 13 for switching a signal at the node N1 in response to an external first drive signal. The first NMOS transistor Q1 has its gate for inputting the first pulse signal from the first input line 11.

The pulse signal transfer unit further comprises a second input line 21 for inputting an external second pulse signal, a second NMOS transistor Q2 connected between the ground voltage source Vss and the node N1, a PMOS transistor Q3 connected between a supply voltage source Vcc and the node N1 for supplying a high voltage from the supply voltage source Vcc to the node N1, a feedback loop circuit 100 for delaying and feeding back the signal at the node N1 to control the PMOS transistor Q3, and a second NOR gate 23 for switching the signal at the node N1 in response to an external second drive signal. The second NMOS transistor Q2 has its gate for inputting the second pulse signal from the second input line 21.

The feedback loop circuit 100 includes a first delay circuit 50 connected between the node N1 and a node N2 for delaying the signal at the node N1, a first edge detection circuit 60 connected to the node N2 for detecting an edge of an output signal from the first delay circuit 50, a second delay circuit 70 connected between the node N2 and a node N3 for delaying the output signal from the first delay circuit 50, and a second edge detection circuit 80 connected to the node N3 for detecting an edge of an output signal from the second delay circuit 70.

The feedback loop circuit 100 further includes a NAND gate 86 for NANDing an output signal from the second edge detection circuit 80 in response to an external control signal from a control line 85, a NAND gate 87 for NANDing an output signal from the NAND gate 86 and an output signal from the first edge detection circuit 60, and an inverter 88 for inverting an output signal from the NAND gate 87 and applying the inverted signal to the gate of the PMOS transistor Q3.

The first delay circuit 50 includes two inverters 51 and 52 connected in series between the nodes N1 and N2 for delaying the signal at the node N1 for a predetermined time period t and supplying the delayed signal to the node N2. The second delay circuit 70 includes two inverters 71 and 72 connected in series between the nodes N2 and N3 for delaying a signal at the node N2 for the predetermined time period t and supplying the delayed signal to the node N3. The first edge detection circuit 60 includes two inverters 61 and 62 connected in series to the node N2 for delaying the signal at the node N2 for the predetermined time period t, a NAND gate 63 for NANDing an output signal from the inverter 62 and the signal at the node N2, and an inverter 64 for inverting an output signal from the NAND gate 63. The second edge detection circuit 80 includes two inverters 81 and 82 connected in series to the node N3 for delaying the signal at the node N3 for the predetermined time period t, a NAND gate 83 for NANDing an output signal from the inverter 82 and the signal at the node N3, and an inverter 84 for inverting an output signal from the NAND gate 83.

The operation of the pulse signal transfer unit with the above-mentioned construction and the first embodiment of the present invention will hereinafter be described in detail with reference to FIG. 5.

FIG. 5 is a timing diagram illustrating the operation of the pulse signal transfer unit in accordance with the present invention. First, when the first pulse signal from the first input line 11 as shown in (A) of FIG. 5 is applied to the gate of the first NMOS transistor Q1, the first NMOS transistor Q1 is turned on to supply a low level signal to the node N1. The low level signal at the node N1 is delayed for the predetermined time period t by the inverters 51 and 52 in the first delay circuit 50 and then applied to the first edge detection circuit 60. The inverters 61 and 62 in the first edge detection circuit 60 delay the signal at the node N2 for the predetermined time period t. As a result, the first edge detection circuit 60 performs an AND operation with respect to the signal at the node N2 delayed by time t from the signal at the node N1 and the output signal from the inverter 62 delayed by time 2t from the signal at the node N1. As a result of the AND operation, the first edge detection circuit 60 generates an edge detection signal which has a pulse width corresponding to time t as shown in (E) of FIG. 5.

The signal at the node N2 is also delayed for the predetermined time period t by the inverters 71 and 72 in the second delay circuit 70 and then applied to the second edge detection circuit 80. The inverters 81 and 82 in the second edge detection circuit 80 delay the signal at the node N3 for the predetermined time period t. As a result, the second edge detection circuit 80 performs an AND operation with respect to the signal at the node N3 delayed by time 2t from the signal at the node N1 and the output signal from the inverter 82 delayed by time 3t from the signal at the node N1, to generate an edge detection signal. The edge detection signal from the second edge detection circuit 80 is applied to the NAND gate 86 which is also applied with a write drive signal from the control line 85 as shown in (C) of FIG. 5. The NAND gate 86 NANDs the inputted two signals and outputs the NANDed result to the NAND gate 87. The NAND gate 87 NANDs the output signal from the first edge detection circuit 60 and the output signal from the NAND gate 86. The inverter 88 inverts the output signal from the NAND gate 87 and applies the inverted signal to the gate of the PMOS transistor Q3. In the case where the output signal from the inverter 88 is low in level, the PMOS transistor Q3 is turned on to generate a low level signal with a pulse width corresponding to time 2t as shown in (D) of FIG. 5 on the data line 40. At this time, if the first drive signal is low in level, the first NOR gate 13 supplies the pulse signal with the pulse width corresponding to time 2t as shown in (D) of FIG. 5 externally.

Thereafter, if the second pulse signal from the second input line 21 as shown in (B) of FIG. 5 is applied to the gate of the second NMOS transistor Q2, the above-mentioned operation is repeatedly performed to generate a low level signal with a pulse width corresponding to time 3t as shown in (D) of FIG. 5 on the data line 40. At this time, if the second drive signal is low in level, the second NOR gate 23 supplies the pulse signal with the pulse width corresponding to time 3t as shown in (D) of FIG. 5 to a decoder (not shown).

Figure 4:
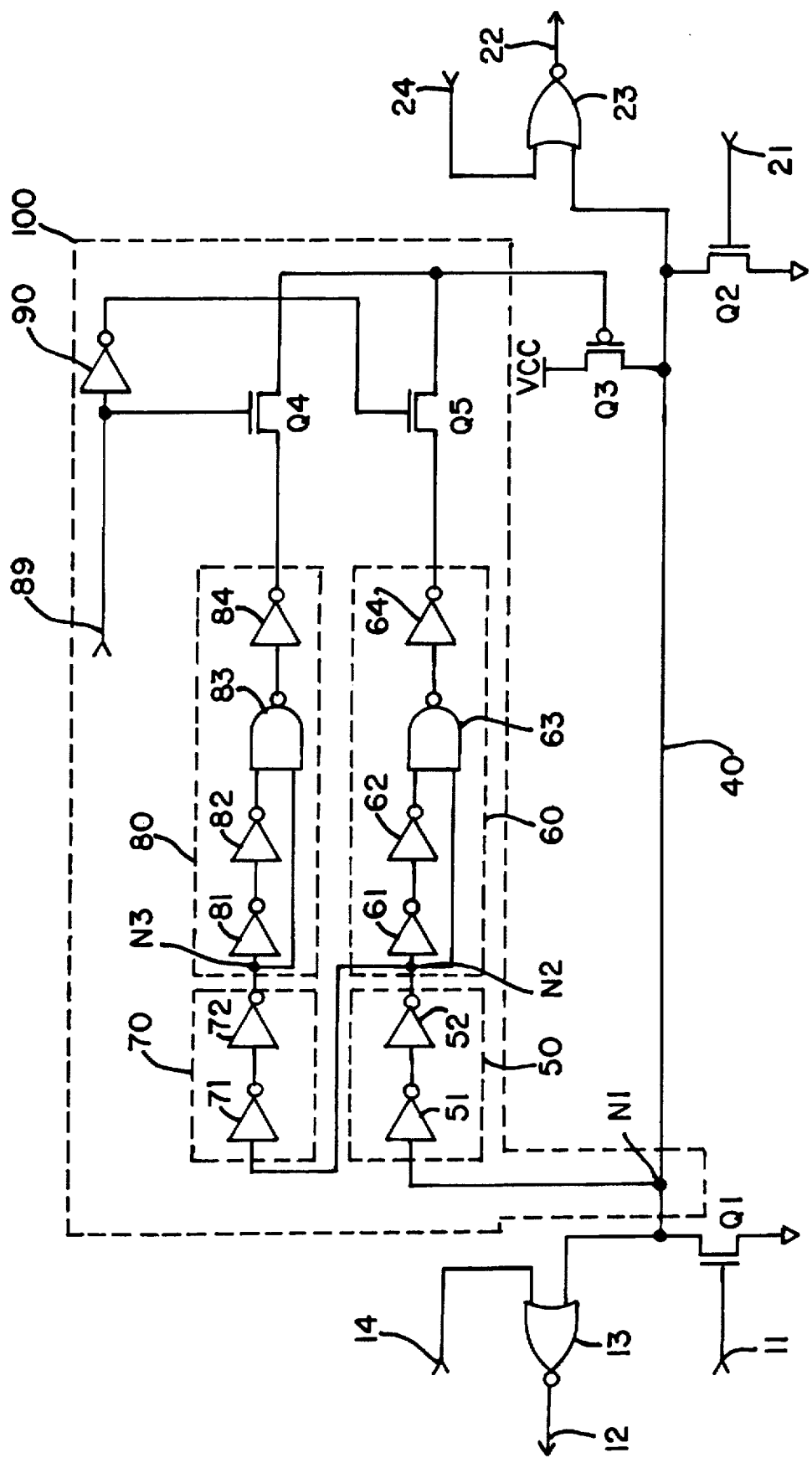
FIG. 4 is a circuit diagram illustrating the construction of a pulse signal transfer unit employing post charge logic in accordance with a second embodiment of the present invention.

FIG. 4 is a circuit diagram illustrating the construction of a pulse signal transfer unit employing post charge logic in accordance with a second embodiment of the present invention. As shown in this drawing, the construction of the second embodiment of the present invention is substantially the same as that of the first embodiment of the present invention, with the exception that NMOS transistors Q4 and Q5 and an inverter 90 are provided instead of the NAND gates 86 and 87 and the inverter 88 in the first embodiment. The NMOS transistor Q4 is connected between the second edge detection circuit 80 and the gate of the PMOS transistor Q3 and has its gate for inputting the write drive signal as shown in (C) of FIG. 5 from a control line 89. The inverter 90 is adapted to invert the write drive signal from the control line 89. The NMOS transistor Q5 is connected between the first edge detection circuit 60 and the gate of the PMOS transistor Q3 and has its gate for inputting an output signal from the inverter 90. The second embodiment of the present invention is substantially the same in construction and operation as the first embodiment of the present invention, and thus a detailed description thereof will be omitted.

As apparent from the above description, according to the present invention, in the case of accessing read data with a relatively narrow pulse width and write data with a relatively wide pulse width, the pulse signal transfer unit initializes the read data at relatively high speed and the write data at relatively low speed to provide a signal with a wider pulse width. Therefore, the pulse signal transfer unit has the effect of preventing the formation of a current path and enhancing the data processing speed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A pulse signal transfer unit employing post charge logic, comprising:

buffering means for transferring data with a specified logic value through a data transfer line;

initialization means for supplying a voltage from a voltage source to said data transfer line to initialize a signal on said data transfer line; and control means for applying the signal on said data transfer line to said initialization means for one of first and second time periods in response to an external write drive signal to control said initialization means, said second time period being longer than said first time period.

2. A pulse signal transfer unit employing post charge logic, as set forth in claim 1, wherein said control means includes:

first delay means for delaying the signal on said data transfer line for said first time period;

first pulse signal generation means for generating a pulse signal with a pulse width beginning with a start time point of an output signal from said first delay means;

second delay means connected to said first delay means for delaying the signal on said data transfer line for said second time period;

second pulse signal generation means for generating a pulse signal with a pulse width beginning with a start time point of an output signal from said second delay means; and switching means for selectively applying the pulse signals from said first and second pulse signal generation means to said initialization means in response to the external write drive signal.

3. A pulse signal transfer unit employing post charge logic, as set forth in claim 2, wherein said first pulse signal generation means includes:

third delay means for delaying the output signal from said first delay means; and first AND logic means for performing an AND operation with respect to the output signal from said first delay means and an output signal from said third delay means; and wherein said second pulse signal generation means includes:

fourth delay means for delaying the output signal from said second delay means; and second AND logic means for performing an AND operation with respect to the output signal from said second delay means and an output signal from said fourth delay means.

4. A pulse signal transfer unit employing post charge logic, as set forth in claim 2, wherein said switching means includes:

a first NAND gate for NANDing the output signal from said second pulse signal generation means in response to the write drive signal;

a second NAND gate for NANDing an output signal from said first NAND gate and the output signal from said first pulse signal generation means; and an inverter for inverting an output signal from said second NAND gate and applying the inverted signal to said initialization means.

5. A pulse signal transfer unit employing post charge logic, as set forth in claim 2, wherein said switching means includes:

first switching means for applying the output signal from said first pulse signal generation means to said initialization means in response to the write drive signal; and second switching means for applying the output signal from said second pulse signal generation means to said initialization means in response to the write drive signal.

6. A pulse signal transfer unit employing post charge logic, as set forth in claim 5, wherein each of said first and second switching means includes an NMOS transistor.

* * * * *